(12) United States Patent
Su

(10) Patent No.: US 7,695,337 B2
(45) Date of Patent: Apr. 13, 2010

(54) ORGANIC LIGHT-EMITTING DIODE AND METHOD OF FABRICATING THE SAME

(75) Inventor: Chih-Hung Su, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/329,693

(22) Filed: Dec. 8, 2008

(65) Prior Publication Data

US 2009/0093082 A1  Apr. 9, 2009

Related U.S. Application Data

(62) Division of application No. 10/882,744, filed on Jul. 1, 2004, now Pat. No. 7,477,012.

(30) Foreign Application Priority Data

Mar. 25, 2004  (TW) ............... 93108066 A

(51) Int. Cl.
*H05B 33/10* (2006.01)
(52) U.S. Cl. ............... 445/35; 445/58; 313/504
(58) Field of Classification Search ......... 313/498–512; 315/169.3; 345/36, 45, 76; 445/35, 58
See application file for complete search history.

(56) References Cited

U.S. PATENT DOCUMENTS

| | | | |
|---|---|---|---|
| 5,882,761 A | 3/1999 | Kawami et al. | |
| 6,198,220 B1 | 3/2001 | Jones et al. | |
| 6,274,979 B1 | 8/2001 | Celii et al. | |
| 6,284,342 B1 | 9/2001 | Ebisawa et al. | |
| 2002/0021088 A1 | 2/2002 | Howard et al. | |
| 2002/0033664 A1* | 3/2002 | Kobayashi | 313/504 |
| 2002/0070663 A1 | 6/2002 | Ogura et al. | |
| 2002/0172839 A1 | 11/2002 | Van Hal et al. | |
| 2003/0117066 A1 | 6/2003 | Silvernail | |
| 2004/0021415 A1 | 2/2004 | Vong et al. | |

FOREIGN PATENT DOCUMENTS

| | | |
|---|---|---|
| CN | 1334610 | 12/2008 |
| TW | 490868 | 6/2002 |

OTHER PUBLICATIONS

Taiwan Office Action mailed Jul. 27, 2006.
China Office Action mailed Apr. 6, 2007.

\* cited by examiner

*Primary Examiner*—Nimeshkumar D Patel
*Assistant Examiner*—Christopher M Raabe
(74) *Attorney, Agent, or Firm*—Thomas, Kayden, Horstemeyer & Risley

(57) ABSTRACT

An organic light-emitting diode and method of fabricating the same. The organic light-emitting diode includes a first substrate, a first electrode installed on an inner surface of the first substrate, an organic light-emitting layer installed on the first electrode, a second electrode installed on the organic light-emitting layer, an oxide layer formed on the second electrode, and a second substrate bound to the inner surface of the first substrate to form an airtight space.

9 Claims, 4 Drawing Sheets

ORGANIC LIGHT-EMITTING DIODE AND METHOD OF FABRICATING THE SAME

CROSS REFERENCE TO RELATED APPLICATIONS

This application is a divisional of pending U.S. patent application Ser. No. 10/882,744, filed Jul. 1, 2004 and entitled "ORGANIC LIGHT-EMITTING DIODE AND METHOD OF FABRICATING THE SAME", which is hereby incorporated by reference.

BACKGROUND OF THE INVENTION

1. Field of the Invention

The present invention relates to an optoelectrical device, and more specifically to an organic light-emitting diode and method of fabricating the same.

2. Description of the Related Art

Generally, moisture may permeate an OLED device with long-term use, and, due to a highly activated metal electrode and the loose structure thereof, permeated moisture continuously reacts to the electrode and rapidly enters interior elements, resulting in cleavage of materials or dark spots, and reduced active lifetime of an OLED device.

Currently, compressing the surface structure of a metal electrode, and installing a power drying agent to absorb moisture are the primary methods of preventing moisture damage and prolonging the active lifetime of an OLED device.

Furthermore, various technologies for reducing interior humidity have been developed to eliminate dark spots, such as forming photo-hardened resin on the glass substrate, plating a metal oxide, fluoride or sulfide on the glass substrate, forming a water-resistant film on the glass substrate, and using an airtight case to package the OLED element. Nevertheless, other problems, such as leakage current, crosstalk and oxide dissolution, still exist.

An OLED structure is disclosed in U.S. Pat. No. 5,882,761, and represented in FIG. 1. Referring to FIG. 1, an organic light-emitting device includes a glass substrate 10, a sealing agent 9 composed of a UV-cured resin and smeared on the rim of the glass substrate 10, and a sealing case 7 bound to the rim of the glass substrate 10 by the sealing agent 9, forming an airtight space.

An illuminative body 6 is formed on the surface of the glass substrate 10, comprising an anode layer 3, an organic-emitting layer 4, and a cathode layer 5. A drying layer 8 is installed on the bottom and side walls of the sealing case 7, and dried inert gas is filled in an interior space 11 constituted by the drying layer 8 and the illuminative body 6. The drying layer 8 comprises a solid compound, such as BaO, CaO, $CaSO_4$, and $CaCl_2$, which chemically absorbs moisture and remains in a solid state. The drying layer 8 is a sheet body fixed on the concave of the sealing case 7 via bonding.

Moisture may also react to metal electrodes, if a drying agent provides less absorption than the metal electrodes, and process cost and a device size may increase due to installation thereof.

SUMMARY OF THE INVENTION

In order to solve the conventional problems, an object of the invention is to provide an OLED having a densified metal electrode to prevent damage to interior elements from moisture.

The OLED structure provided in the invention includes a first substrate, a first electrode installed on an inner surface of the first substrate, an organic light-emitting layer installed on the first electrode, a second electrode installed on the organic light-emitting layer, an oxide layer formed on the second electrode, and a second substrate bound to the inner surface of the first substrate to form an airtight space.

The oxide layer formed on the electrode in the present invention solves the problem of exterior moisture permeation of illuminative elements. Additionally, the device does not employ a drying agent and as such offers reduced size and process cost.

Another OLED structure provided in the invention includes a substrate, a first electrode installed on the substrate, an organic light-emitting layer installed on the first electrode, a second electrode installed on the organic light-emitting layer, and an oxide layer formed on the second electrode.

Owing to the oxide layer cover, the size of an illuminative area of the display without a sealing case can be remained even though the display is exposed to air for hundreds of hours.

Another object of the invention is to provide a method of fabricating an OLED, including the following steps. A substrate is provided. A first electrode is formed on the substrate. Subsequently, an organic light-emitting layer is formed on the first electrode. A second electrode is then formed on the organic light-emitting layer. Finally, an oxygen plasma procedure is performed to form an oxide layer on the surface of the second electrode.

In the present invention, the oxide layer formed by the oxygen plasma procedure can prevent damage to interior elements from moisture because the electrode structure has been densified. Additionally, the metal electrode may not be continuously oxidized when the oxide layer is formed. Finally, the display without a sealing case can reduce the size to conform to the panel display development trend toward light-weight, thin profile, and small size.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
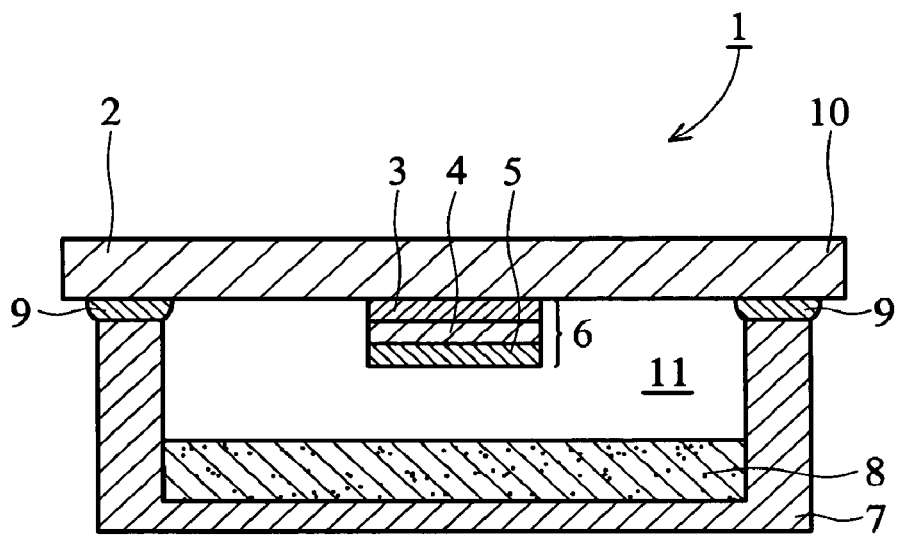
FIG. 1 is a cross section of an OLED in U.S. Pat. No. 5,882,761.
Figure 2:
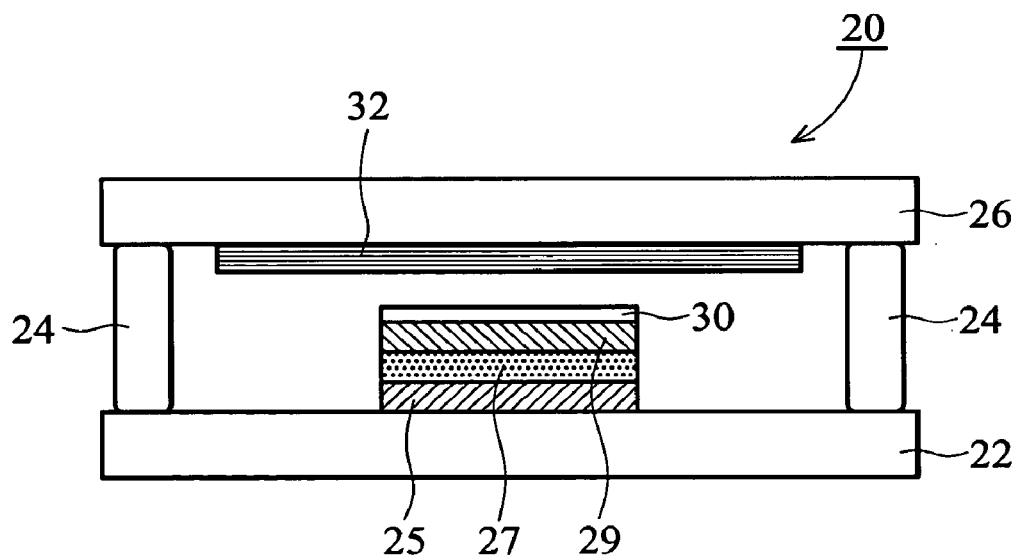
FIGS. 2~4 are cross sections of the method of fabricating an OLED in the first embodiment of the invention.

FIG. 2 is a cross section of the method of fabricating the OLED according to the first embodiment of the invention. First, referring to FIG. 2, a substrate 22 is provided. The substrate 22 includes a transparent glass substrate or plastic substrate, wherein the plastic substrate is composed of polyethyleneterephthalate, polyester, polycarbonates, polyimide, arton, polyacrylates, or polystyrene.

Next, a first electrode 25 is formed on the substrate 22. The first electrode is a transparent electrode, and may comprise indium tin oxide (ITO), indium zinc oxide (IZO), aluminum zinc oxide (AZO), or zinc oxide (ZnO).

Subsequently, an organic light-emitting structural layer is formed on the first electrode 25, comprising an electron-transport layer (not shown), an organic light-emitting layer 27, and a hole-transport layer (not shown) in order. The organic light-emitting layer 27 includes a single or multiple organic illuminative layers. The organic illuminative materials comprise micromolecules or macromolecules of fluorescent or phosphorescent materials, wherein the micromolecule organic illuminative materials covering the first electrode 25 are formed by vacuum evaporation, and the macromolecule organic illuminative materials are formed by spin-on, ejection, or screen printing.

Figure 3:
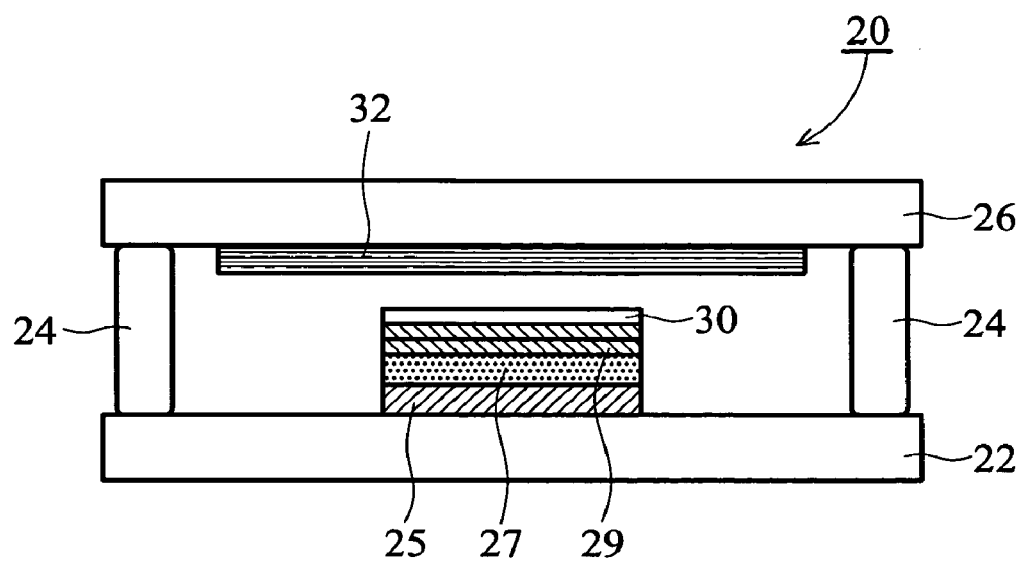

Next, a second electrode 29 is formed on the organic light-emitting layer 27. The second electrode 29 may be a single or multiple metal electrode layers, and may compose Li, Mg, Ca, Al, Ag, In, Au, Ni, Pt, or combinations thereof. Multiple metal electrode layers can prevent the formation of a defective oxide layer, as shown in FIG. 3.

Subsequently, an oxygen plasma procedure is performed on the surface of the second electrode 29 to form a metal oxide layer 30, wherein the oxygen flow rate is about 10~50 sccm, preferably 30 sccm, the temperature is about 20~30° C., preferably 25° C., the pressure is about 0.05~0.15 torr, preferably 0.1 torr, the power is less than 200 W, preferably 30 W, and the time is about 800~1000 sec, preferably 900 sec.

Figure 4:
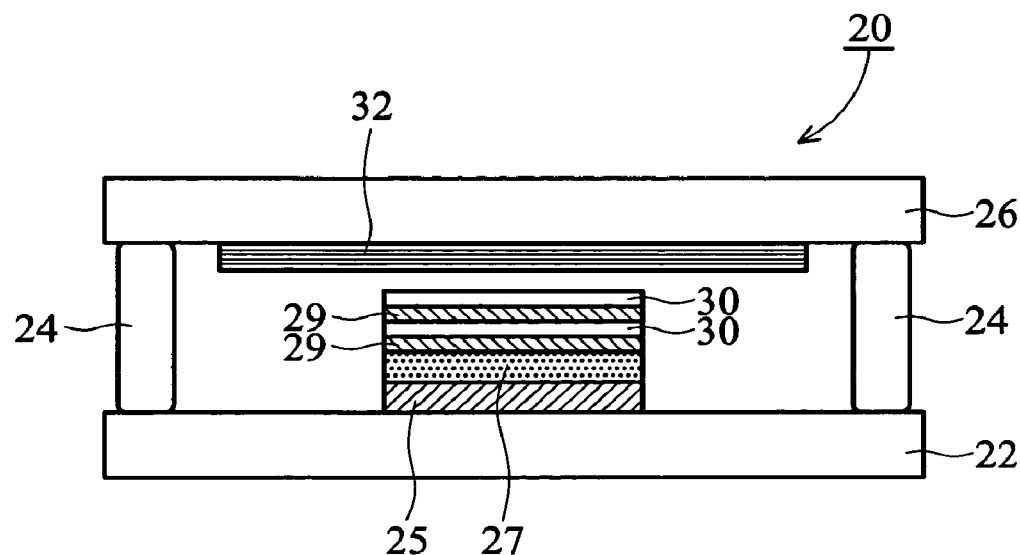

The metal oxide layer 30 is formed by directly performing oxygen plasma on the second electrode 29. The second electrode structure may comprise a single metal layer 29 and a single oxide layer 30, multiple metal layers 29 and a single oxide layer 30, as shown in FIG. 3, or multiple metal layers 29 and multiple oxide layers 30, as shown in FIG. 4.

The structure of multiple metal layers 29 and a single oxide layer 30 can be fabricated by performing oxygen plasma on the last metal layer, after numerous metal layers 29 are deposited, and the structure of multiple metal layers 29 and multiple oxide layers 30 can be fabricated by performing oxygen plasma on a metal layer during an interval between two depositions. An oxide layer 30 without defects can then be formed in the above structures.

Subsequently, a sealing agent 24 is smeared on the rim of the substrate 22. The sealing agent 24 may be composed of a UV-cured resin. Finally, a sealing case 26 is bound to bind the rim of the substrate 22 by the sealing agent 24, and an airtight space containing the first electrode 25, an organic light-emitting layer 27, and the second electrode 29 is formed. The sealing case 26 may be a plane or concave substrate, and comprise glass, polymer, ceramic, or metal.

Additionally, a drying layer 32 may be installed on the inner surface of the sealing case 26. The drying layer 32 may comprise metal oxide (e.g. alkaline metal oxide or alkaline-earth metal oxide), metal sulfide, metal halide, metal perchlorate, or highly active metal (e.g. alkaline metal or alkaline-earth metal). The thickness of the drying layer 32 is less than 10 μm, preferably 1~2 μm.

Compared to the related art, which requires a large quantity of drying agent to absorb moisture, the present invention only requires a small quantity of drying agent or none at all due to the densified metal electrode. Accordingly, when an oxide layer is formed, it may further prevent metal electrode oxidation.

Second Embodiment

Figure 5:
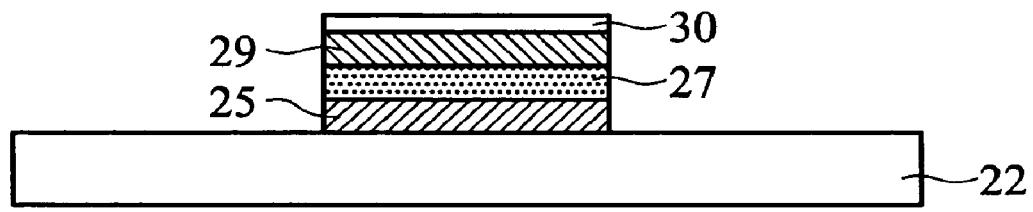
FIGS. 5~7 are cross sections of the method of fabricating an OLED in the second embodiment of the invention.

FIG. 5 is a cross section of the method of fabricating the OLED according to the second embodiment of the invention.

First, referring to FIG. 5, a substrate 52 is provided. The substrate 52 includes a transparent glass substrate or plastic substrate, wherein the plastic substrate is composed of polyethyleneterephthalate, polyester, polycarbonates, polyimide, arton, polyacrylates, or polystyrene.

Next, a first electrode 55 is formed on the substrate 52. The first electrode is a transparent electrode, and may comprise indium tin oxide (ITO), indium zinc oxide (IZO), aluminum zinc oxide (AZO), or zinc oxide (ZnO).

Subsequently, an organic light-emitting structural layer is formed on the first electrode 55, comprising an electron-transport layer (not shown), an organic light-emitting layer 57, and a hole-transport layer (not shown) in order. The organic light-emitting layer 57 includes a single or multiple organic illuminative layers. The organic illuminative materials comprise micromolecules or macromolecules of fluorescent or phosphorescent materials, wherein the micromolecule organic illuminative materials covering the first electrode 55 are formed by vacuum evaporation, and the macromolecule organic illuminative materials are formed by spin-on, ejection, or screen printing.

Figure 6:
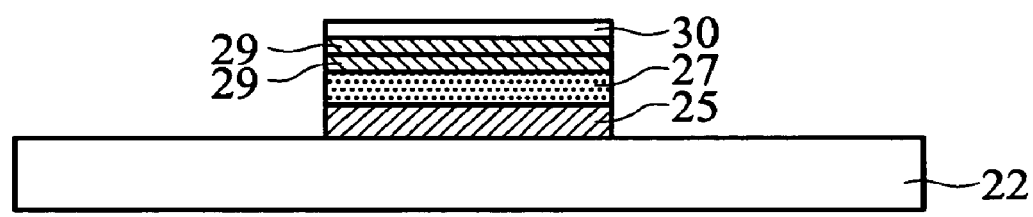

Next, a second electrode 59 is formed on the organic light-emitting layer 57. The second electrode 59 may be a single or multiple metal electrode layers, and may comprise Li, Mg, Ca, Al, Ag, In, Au, Ni, Pt, or combinations thereof. Multiple metal electrode layers can prevent formation of a defective oxide layer, as shown in FIG. 6.

Subsequently, an oxygen plasma procedure is performed on the surface of the second electrode 59 to form a metal oxide layer 60, wherein the oxygen flow rate is about 10~50 sccm, preferably 30 sccm, the temperature is about 20~30° C., preferably 25° C., the pressure is about 0.05~0.15 torr, preferably 0.1 torr, the power is less than 200 W, preferably 30 W, and the time is about 800~1000 sec, preferably 900 sec.

Figure 7:
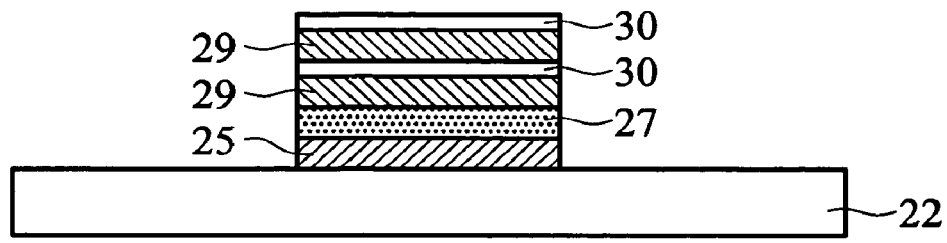

The metal oxide layer 30 is formed by directly performing an oxygen plasma procedure on the second electrode 29. The second electrode structure may comprise a single metal layer 59 and a single oxide layer 60, multiple metal layers 59 and a single oxide layer 60, as shown in FIG. 6, or multiple metal layers 59 and multiple oxide layers 60, as shown in FIG. 7.

The structure of multiple metal layers 59 and a single oxide layer 60 can be fabricated by performing an oxygen plasma procedure on the last metal layer, after numerous metal layers 59 are deposited, the structure of multiple metal layers 59 and multiple oxide layers 60 can be fabricated by performing an oxygen plasma procedure on a metal layer during an interval between two depositions. Accordingly, an oxide layer 60 without defects can then be formed in the above structures.

Owing to the oxide layer cover, the size of an illuminative area of the display without a sealing case can be remained even though the display is exposed to air for hundreds of hours in the embodiment, and as it will facilitate to the panel display development trend toward light-weight, thin profile, and small size.

Figure 8:
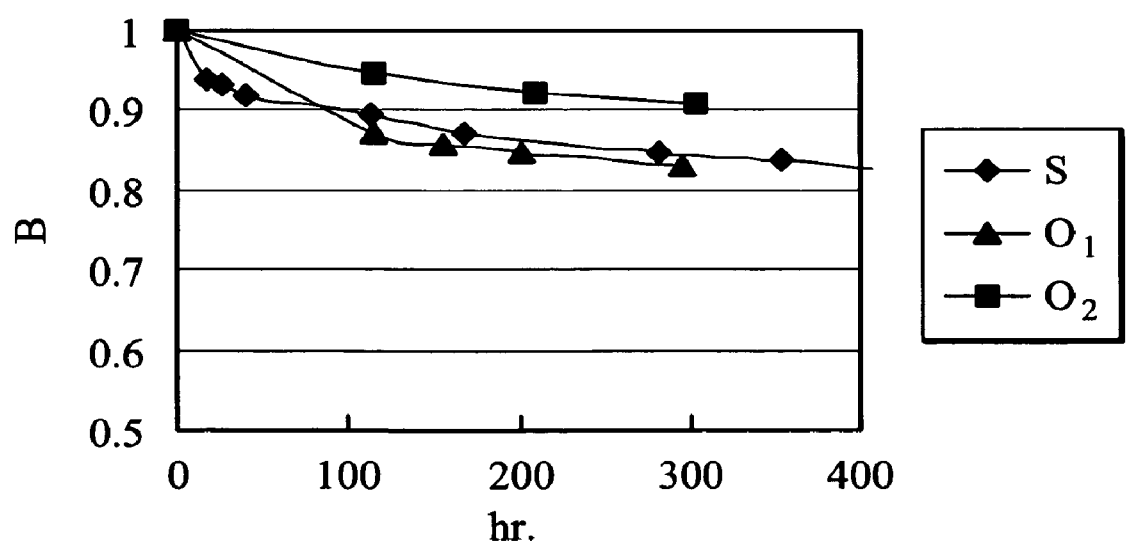
FIG. 8 is a graph plotting brightness against time of various OLEDs as disclosed in an embodiment of the invention.

FIG. 8 is a graph plotting brightness (B) against time (hour) of various OLEDs, wherein B is a ratio of measuring brightness to initial brightness, rhombus (S) represents the display having a sealing case and a drying regent, triangular ($O_1$) represents the display having a single oxide layer, but without having a sealing case and a drying regent, rectangular ($O_2$) represents the display having two oxide layers, but without having a sealing case and a drying regent.

Referring to FIG. 8, the illuminative performance of the display having two oxide layers is superior to the others. This is because an oxide layer is far enough densitified so as to prevent interior elements from moisture attack, prolonging active lifetime.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating an organic light-emitting diode, comprising:
    providing a substrate;
    forming a first electrode on the substrate;
    forming an organic light-emitting layer on the first electrode;
    forming a second electrode on the organic light-emitting layer;
    performing an oxygen plasma procedure on the surface of the second electrode to form a first oxide layer;
    installing a metal layer on the first oxide layer; and
    performing an oxygen plasma procedure on the surface of the metal layer to form a second oxide layer.

2. The method as claimed in claim 1, wherein the second electrode is composed of a single or multiple metal layers.

3. The method as claimed in claim 1, wherein the metal layer or the electrodes are Li, Mg, Ca, Al, Ag, In, Au, Ni, Pt, or combinations thereof.

4. The method as claimed in claim 1, wherein the gas flow rate of the oxygen plasma procedure is about 10~50 sccm.

5. The method as claimed in claim 1, wherein the power of the oxygen plasma procedure is less than 200 W.

6. The method as claimed in claim 1, wherein the first or second oxide layer is composed of an oxide of the metals or combinations thereof.

7. The method as claimed in claim 1, wherein the thickness of the first or second oxide layer is about 10~100 Å.

8. The method as claimed in claim 1, further comprising, after the oxygen plasma procedure is performed, providing a sealing case to bind the substrate to form an airtight space containing the electrodes.

9. The method as claimed in claim 1, further comprising, installing a drying layer on the sealing case in the airtight space.

* * * * *